(12) United States Patent
Rahbari Asr et al.

(10) Patent No.: US 10,955,453 B2
(45) Date of Patent: Mar. 23, 2021

(54) NEURO-ADAPTIVE ONBOARD/OFFBOARD FAULT DETECTOR FOR DIGITAL CHARGING

(71) Applicant: FORD GLOBAL TECHNOLOGIES, LLC, Dearborn, MI (US)

(72) Inventors: Navid Rahbari Asr, Inkster, MI (US); Lila Ghannam, Northville, MI (US); Yuan Zhang, Southgate, MI (US); Jeffery R. Grimes, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 336 days.

(21) Appl. No.: 16/163,657

(22) Filed: Oct. 18, 2018

(65) Prior Publication Data

US 2020/0124653 A1 Apr. 23, 2020

(51) Int. Cl.
*G01R 31/00* (2006.01)
*G01R 31/40* (2020.01)
*G06N 3/08* (2006.01)
*G01S 19/01* (2010.01)

(52) U.S. Cl.
CPC .......... *G01R 31/006* (2013.01); *G01R 31/40* (2013.01); *G06N 3/08* (2013.01); *G01S 19/01* (2013.01)

(58) Field of Classification Search
CPC .... B60L 53/16; B60L 3/0046; Y02T 10/7072; Y02T 90/12; Y02T 90/14; Y02T 10/70; Y02T 90/16; Y02T 90/167; Y02T 10/72; G01R 31/006; G01R 31/40; G06N 3/08; G01S 19/01; H02J 7/0047; H02J 13/00002; H02J 7/00034
See application file for complete search history.

(56) References Cited

U.S. PATENT DOCUMENTS

| | | | |
|---|---|---|---|
| 2016/0096438 A1* | 4/2016 | Grimes | B60L 53/18 320/109 |
| 2017/0016988 A1* | 1/2017 | Numata | G01S 7/023 |
| 2018/0202825 A1* | 7/2018 | You | B60L 58/12 |
| 2019/0016329 A1* | 1/2019 | Park | B60K 6/32 |
| 2019/0064849 A1* | 2/2019 | O'Hara | H02J 7/0047 |
| 2019/0184842 A1* | 6/2019 | Waters | H02J 7/0047 |

FOREIGN PATENT DOCUMENTS

| | | |
|---|---|---|
| CN | 106096058 A | 11/2016 |
| WO | 2016203655 A1 | 12/2016 |

* cited by examiner

*Primary Examiner* — Mohammad K Islam
(74) *Attorney, Agent, or Firm* — David B. Kelley; Brooks Kushman P.C.

(57) ABSTRACT

An electrified vehicle includes a global positioning system (GPS) module. The vehicle further includes a controller programmed to learn a source identification for a charging error during charge events. The controller receives location data corresponding to each charging error and utilizes the location data to determine the source identification. The source identification may be indicative of the vehicle, an offboard charger, and the operator. Errors that occur consistently at multiple locations may be assigned a higher probability of being identified as vehicle-related errors.

20 Claims, 3 Drawing Sheets

NEURO-ADAPTIVE ONBOARD/OFFBOARD FAULT DETECTOR FOR DIGITAL CHARGING

TECHNICAL FIELD

This application generally relates to identifying a source of charging system communication failures.

BACKGROUND

Electrified vehicles are configured to be charged by an offboard charger. Charging standards, such as International Standards Organization (ISO) 15118, are available that describe the interfaces between the vehicle and the offboard charger. Recent charging systems support features such as Plug and Charger (PnC), Smart Charge Scheduling, Vehicle-to-Grid (V2G) and Vehicle-to-Home (V2H) charging strategies. Implementing these new strategies has led to increased complexity in communication and coordination between the vehicle and offboard charger.

SUMMARY

A vehicle includes a controller programmed to receive location data from a global positioning system module and change a source identification for a charging error to a value representing the vehicle responsive to the charging error occurring at a predetermined number of different locations, and, change the source identification to a value representing an offboard charger responsive to the charging error occurring a predetermined number of times at a same location.

The controller may be further programmed to change the source identification to a value representing an operator responsive to the charging error occurring intermittently over a predetermined number of charge events at a same location and not occurring for at least one charge event at a different location. The controller may be further programmed to learn the source identification using a neural network algorithm. The controller may be further programmed to assign a probability corresponding to each value of the source identification for the charging error and change the probability based on a location derived from the location data. The controller may be further programmed to increase the probability associated with the source identification being the value representing the vehicle responsive to occurrences of the charging error at different locations. The controller may be further programmed to increase the probability associated with the source identification being the value representing the offboard charger responsive to occurrences of the charging error at a same location. The controller may be further programmed to initialize the source identification for the charging error to a value representing an unknown source.

A method performed by a controller includes learning a source identification for a charging error that occurs when a vehicle is coupled to an offboard charger. The method further includes changing the source identification from a default identifier to an identifier representing the vehicle responsive to the charging error occurring at least a predetermined number of times with corresponding position coordinates being indicative of different locations. The method further includes changing a recommended service procedure responsive to changing the source identification.

The method may further include changing the source identification to an identifier representing the offboard charger responsive to the charging error occurring at least a predetermined number of times with corresponding position coordinates being indicative of a same location. The method may further include assigning a probability corresponding to each value of the source identification and changing the probability based on a location derived from the corresponding position coordinates. The method may further include increasing the probability associated with the source identification being the vehicle responsive to occurrences of the charging error at different locations. The method may further include increasing the probability associated with the source identification being the offboard charger responsive to occurrences of the charging error at a same location. The method may further include changing, responsive to the charging error occurring less than the predetermined number of times and the probability associated with the source identification being the vehicle being greater than a predetermined probability, the source identification from the default identifier to the identifier representing a vehicle. The method may further include learning the source identification using a neural network.

A vehicle diagnostic system includes a controller programmed to receive location data from a global positioning system module, learn a source identification for a charging error that occurs during charge events, and, responsive to the charging error occurring at least a predetermined number of times with corresponding location data being indicative of the charging error occurring at different locations, change the source identification from a default identifier to an identifier representing the vehicle.

The controller may be further programmed to, responsive to the charging error occurring at least a predetermined number of times with corresponding location data being indicative of the charging error occurring at a same location, change the source identification from the default identifier to an identifier representing an offboard charger. The controller may be further programmed to, responsive to the charging error occurring intermittently over a predetermined number of charge events at a same location and not occurring for at least one charge event at a different location, change the source identification from the default identifier to an identifier representing an operator. The controller may be further programmed to assign a probability corresponding to each value of the source identification and change the probability based on a location derived from the location data. The controller may be further programmed to increase the probability associated with the source identification being the vehicle responsive to occurrences of the charging error at different locations. The controller may be further programmed to, responsive to the charging error occurring less than the predetermined number of times and the probability associated with the source identification being the vehicle being greater than a predetermined probability, change the source identification from the default identifier to the identifier representing the vehicle.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Digital communication-based charging is becoming more prevalent due to the development of new standards (e.g., ISO 15118, GBT27930) and customer expectations. These types of charge systems were originally developed for high-power DC charging. Due to the popularity of new features such as Plug and Charge (PnC), Smart Charge Scheduling, Vehicle-to-Grid (V2G) and Vehicle-to-Home (V2H), digital communication-based charging (digital charging) is becoming more popular for AC charge stations.

Digital charging results in more complexity in the charging system. Communication between vehicle and charger requires more cooperation and interaction between onboard and offboard systems. This provides more chances for unexpected error conditions. The increased complexity makes it difficult to detect whether the error was caused by an onboard source or an offboard source (e.g., charge station). The system and methods described herein improve the identification of the source of a charging error. The source of a charging error may be identified as an offboard source (e.g., offboard charger) or an onboard source (e.g., vehicle controller). The system described can learn the source of the charging error based on a location at which the error is detected.

Figure 1:
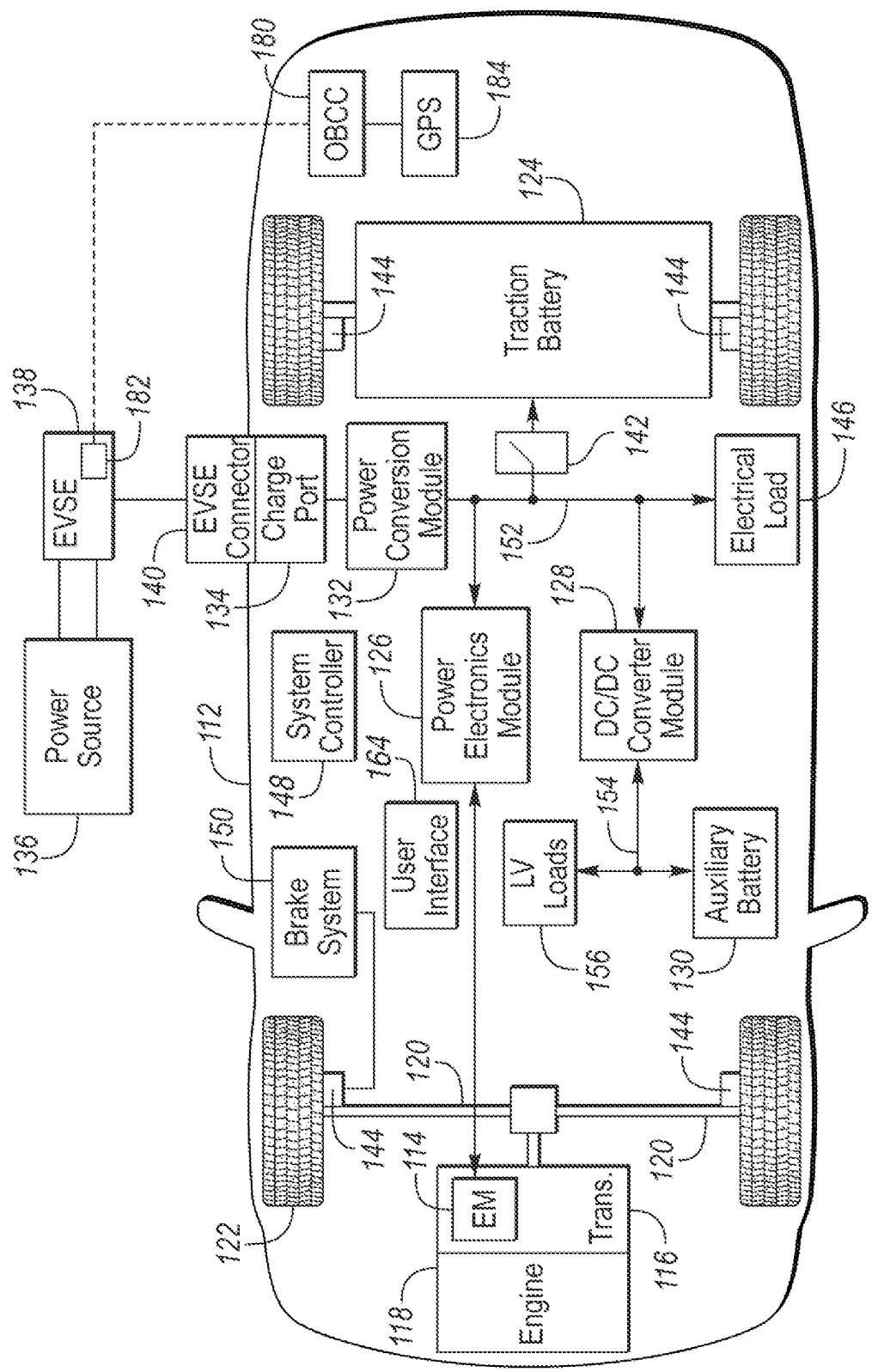
FIG. 1 depicts a possible configuration for an electrified vehicle.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 may be mechanically coupled to a differential 162 that is configured to adjust the speed of drive shafts 120 that are mechanically coupled to drive wheels 122 of the vehicle 112. The drive shafts 120 may be referred to as the drive axle. In some configurations, a clutch may be disposed between the hybrid transmission 116 and the differential 162. The electric machines 114 can provide propulsion and deceleration capability when the engine 118 is turned on or off. The electric machines 114 may also act as generators and can provide fuel economy benefits by recovering energy that would normally be lost as heat in a friction braking system.

The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present.

A battery pack or traction battery 124 stores energy that can be used by the electric machines 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be integrated with the traction battery 124. One or more power electronics modules 126 may be electrically coupled to the high-voltage bus 152. The power electronics modules 126 are also electrically coupled to the electric machines 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when appropriate. Examples of high-voltage electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger 132. The charger 132 may condition the power supplied from the EVSE 138 to provide the proper voltage and current levels to the traction battery 124 and the high-voltage bus 152. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components. Note that operations and procedures that are described herein may be implemented in one or more controllers. Implementation of features that may be described as being implemented by a particular controller is not necessarily limited to implementation by that particular controller. Functions may be distributed among multiple controllers communicating via the vehicle network.

The vehicle 112 may include a global positioning system (GPS) module 184 that is configured to provide location data of the vehicle 112. The GPS module 184 may be included as part of a navigation module. The GPS module 184 may determine position coordinates for the vehicle 112. The position coordinates may be transferred to other modules and controllers over the vehicle network.

The vehicle 112 may include a user interface 164 for interfacing with the operator. The user interface 164 may include display elements, such as lamps or a liquid-crystal display (LCD) module. The display elements may include a touch screen. The user interface 164 may further include input devices, such as switches, buttons, or touch-screen inputs. The user interface 164 may further include a diagnostic port that interfaces with an external diagnostic module. The diagnostic port may include conductors that are coupled to the vehicle network. The diagnostic port may permit the external diagnostic module to interface with controller in the vehicle 112. The external diagnostic module may be configured to send commands to the controllers. For example, various test modes may be entered by commands from the diagnostic module. Controllers in the vehicle may transmit message data to the diagnostic module. The message data may include responses to diagnostic requests as well as status information. The user interface 164 may further include a communications module that is configured to communicate with offboard sources. For example, the communications module may include a wireless network router for connecting to a wireless network and/or a cellular communications modem for communicating with a cellular network. The communications module may be configured to communicate with a remote server. For example, the communications module may permit transfer of diagnostic data to a remote server.

Identifying the source of errors is a basic feature of vehicle diagnostic systems. Accurate identification of the error source allows the problem to be quickly and efficiently resolved. The service technician can read diagnostic codes from the vehicle and readily identify the cause of the problem. For example, identification of the error source may lead to a recommendation to replace or troubleshoot the identified component. Charging system-related errors pose some challenges if the source of the error is not accurately identified. For example, if the error is caused by offboard equipment, it is unlikely that the error can be resolved by servicing the vehicle. Diagnostic reporting in which two different error sources are possible may result in an unnecessary service visit. As such, it is desirable to accurately report the error source to minimize unnecessary service visits and expense. Further, it may be beneficial to provide feedback to the vehicle operator/owner the source of the error and whether or not a service visit is necessary.

Inaccurate error response and reporting may result in false positive error indications. A false positive error indication may be when an error is identified but cannot be corrected by service the vehicle. That is, the error is actually caused by an offboard component. In response to the false positive error indications, the operator may bring the vehicle to a service facility for repairs for error conditions cause by the EVSE 138. A service facility having little experience with digital-based charging may replace controllers or other on-vehicle components. When the error lies with the EVSE 138, these on-vehicle replacements result in unnecessary costs and likely do not solve the problem. This can lead to owner dissatisfaction with the vehicle and the service facility.

The vehicle 112 may include an Off-Board Charge Controller (OBCC) 180 that is configured to manage digital charging with the off-board charge stations or EVSE 138. The OBCC 180 may communicate with the EVSE 138 in a variety of ways. Communications may be via a wireless interface/protocol or may be a wired interface/protocol through the interface defined by the charge port 134 and the EVSE connector 140. The OBCC 180 may be configured to implement one or more message protocols as defined by any applicable standards. The OBCC 180 may include volatile and non-volatile memory to store program instructions and data. The OBCC 180 may include an interface to the vehicle network to communication with other modules in the vehicle 112. For example, the OBCC 180 may communicate with the power conversion module 132 and the traction battery 124. The OBCC 180 may be programmed to detect and respond to charge system errors. Digital charging errors may occur for a variety of reasons. Component issues on the vehicle 112 or EVSE 138 side may prevent communication from being established.

The OBCC 180 may attribute a digital charging error to the vehicle 112 or the EVSE 138. The digital charging errors may be categorized in several ways. Some digital charging errors may be known to be caused by vehicle-based components. For example, the OBCC 180 may detect an error in an onboard circuit or device by monitoring signals within the vehicle 112 or associated controller. These errors may be attributed to the vehicle 112 with a high degree of confidence. Examples may include signals that are shorted to ground or open-circuited. The OBCC 180 may perform diagnostic tests to determine if an error condition is present.

Some digital charging errors may be known to be caused by EVSE-based components. The EVSE 138 may include an EVSE controller 182 that is configured to control and manage operation of the EVSE 138. The EVSE controller 182 may include a communications interface for communicating with the OBCC 180. The EVSE controller 182 may be configured to detect an error in a circuit or device by monitoring signals within the EVSE 138. The EVSE controller 182 may notify the OBCC 180 of an error condition by transferring a message via the communication interface. Such error notifications may be possible when communications are operating. The OBCC 180 may attribute these errors to the EVSE 138.

Some digital charging errors may be caused by operator provided components. For example, digital charging may require a radio-frequency identification (RFID) card that is carried by the vehicle operator and scanned by the EVSE 138. The vehicle operator may not be carrying the correct RFID card. As a result, a digital charging error may occur. Other examples, could include the operator providing an incorrect credit card to pay for services at the charge station. The OBCC 180 may attribute these errors to the operator.

The source of some digital charging errors may not be immediately known. For example, the source of the digital charging error may be indeterminable without additional information. An indeterminable error may occur for a communication timeout. For example, the OBCC 180 may attempt to establish communication and not receive a response within a predetermined amount of time. A timeout error may be logged. However, the source of the error may not be known accurately. An onboard error may prevent the OBCC 180 from properly establishing communication or an offboard error may prevent the offboard charger from establishing communication. An indeterminable error source may occur when the vehicle operator attempts to scan an incorrect RFID card at the charging station. Digital charging may fail without knowledge of the OBCC 180. As such, the OBCC 180 may be unable to provide an adequate source identification.

For the indeterminable error situations, the OBCC 180 may be configured to learn the probable source of the charging error. The OBCC 180 may implement a neuro-adaptive error detection algorithm. The neuro-adaptive error detection algorithm may assign probabilities to the source of an error based on input and output signals of the OBCC 180 at the time the error occurs. The algorithm may assign a probability of the error source being onboard or offboard.

Figure 2:
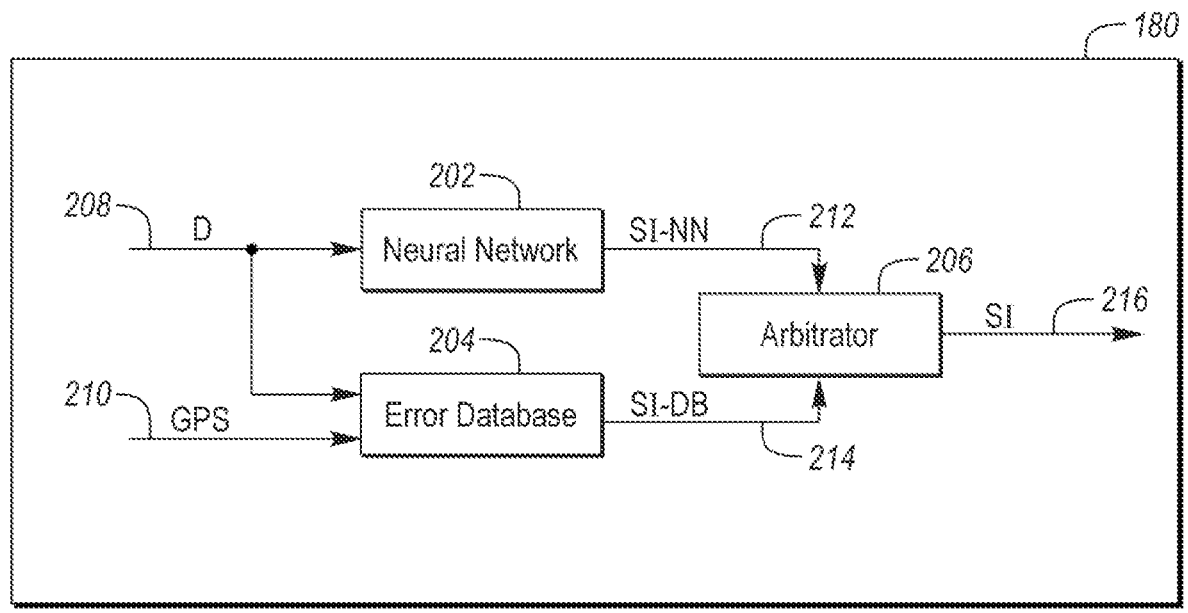
FIG. 2 depicts a block diagram for a possible controller implementation for identifying a source of a charging error between a vehicle and an offboard charger.

FIG. 2 is a block diagram depicting features that may be implemented in the OBCC 180 as part of the vehicle diagnostic system. The OBCC 180 may implement an error database 204 process for determining the source of an error condition. The error database 204 may include a repository of data regarding error conditions. The error database 204 may receive input data D 208. The input data D 208 may include signals and variables associated with error conditions. For each error condition, the error database 204 may store a corresponding set of input data values expected when the error condition is present. The error database 204 may further include a count that is incremented upon the detection of each error condition.

For each of the errors, the error database 204 may include a corresponding identification of the error source. The error source may be identified as onboard, offboard, operator, or unknown. An onboard error source may be indicative of an error condition with the vehicle 112. An offboard error source may be indicative of an error condition with the EVSE 138. An operator error source may be indicative of an error condition caused by the operator. An unknown error source may occur when there is not sufficient data to accurately identify the error source. The input data D 208 may be compared with the stored data to identify an error condition. The error database 204 may output a corresponding source identification SI-DB 214. The error database 204 may receive GPS location data 210. The error database 204 may be updated as error conditions are detected. For example, the error database 204 may be updated with location data for each occurrence of a charging error.

The input data D 208 may include signals and/or variables that may be related to the digital charging errors. The input data D 208 may be the values of the signals and/or variables at the time of the error. For example, the signals may include voltage levels of digital charging-related signals and status indicators from digital charging and communication hardware. The sampling of the signals and variables may occur upon detection of the error. The signals may include voltage levels of power supplies that power various components. The signals may also include status register data from communication modules. The status register data may provide data related to message transmission and reception. The error database 204 may be further configured to determine and output a confidence value or probability of the error database source identification SI-DB 214 being accurate (explained further below).

The source of some errors may be well known. Such errors may be included in the error database 204. Such error conditions may include the corresponding source identification and a confidence value that represents probability that the source identification is accurate.

In parallel to the error database 204, the OBCC 180 may implement a neural network 202 algorithm that is configured to receive the input data D 208 and output an error source identification SI-NN 212. When the neural network 202 is properly tuned, the source identification SI-NN 212 may match the source identification SI-DB 214 produced by the error database 204. The neural network 202 may be further configured to determine and output a confidence value or probability of the neural network source identification SI-NN 212 being accurate (explained further below).

The OBCC 180 may implement an arbitration function 206 to select the source identification produced by the neural network 202 or the error database 204. The arbitration function 206 may determine which source identification to rely on. The error source identification for some errors may be provided with a default value that is indicative of the error source being unknown. For example, some error conditions stored by the error database 204 may be associated with the default value until the error condition occurs a predetermined number of times. The error database 204 may update the error source after receiving data associated with the error condition at a predetermined number of locations. After receiving data from multiple locations associated with the error condition, the error database 204 may update the error source to a value indicative of the offboard equipment, a value indicative of the onboard equipment, or a value indicative of an operator error.

If the error source is identified by the error database 204 as onboard or offboard, the arbitration function 206 may select the output SI-DB 214 of the error database 204 as the error source. As the error database 204 may include reliably identified errors, the results are very likely to be correct. The arbitration function 206 may also compare the confidence or probability value associated with the source identification.

When the error source from the error database 204 is unknown, the output of the neural network 202 may be checked. The output SI-NN 212 of the neural network 202 may identify the source as onboard or offboard. In addition, the output SI-NN 212 of the neural network 202 may have an associated probability of being accurate. The probability may be computed periodically based on the signals and variables and number of error occurrences. If the probability of the neural network output SI-NN 212 is greater than a predetermined threshold, the arbitration function 206 may select the error source identification associated with that probability. The arbitration function 206 may output an arbitrated source identification 216 associated with the error condition.

If the probability is less than the threshold, then the error source may be identified as unknown. In this case, the neural network output SI-NN 212 may not be reliable enough to make a judgment on the error source.

Figure 3:
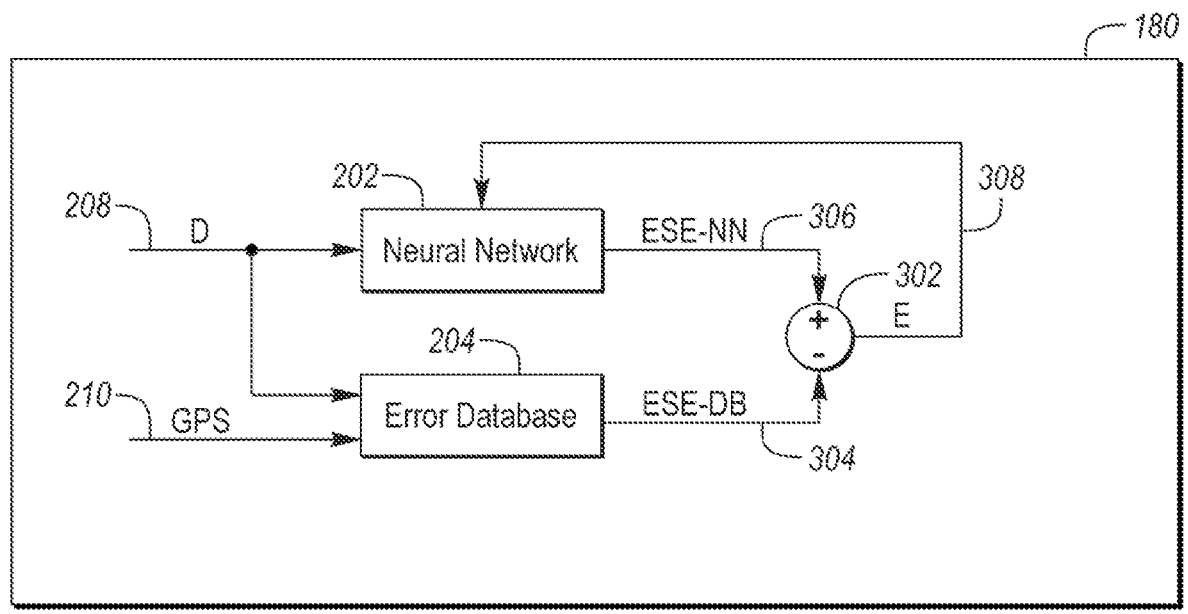
FIG. 3 depicts a block diagram for a possible controller implementation for learning a source of a charging error between a vehicle and an offboard charger.

FIG. 3 depicts a block diagram depicting features that may be implemented in the OBCC 180 for aiding in tuning the neural network 202. The neural network 202 may be tuned by incorporating a feedback error signal 308 for each error source estimation. The error database 204 may receive GPS information 210 from the GPS module 184. The error database 204 may include information regarding the location of each error that is detected. As more occurrences of an error are present, the location data may be analyzed. Errors that occur consistently at the same location, may have a higher probability of being offboard related. Errors that occur at different locations may have a higher probability of being onboard related. Errors that occur occasionally but not consistently at the same location may have a higher probability of being operator related. The error fault database 204 may output a signal ESE-DB 304 representing the probability of the source identification being correct. This probability may increase as more error occurrences are accumulated. The probability may be based on the number of error occurrences and the number of locations at which the error condition occurs.

The neural network 202 may further compare the source identification of the neural network (SI-NN 212) to the source identification generated by the error database (SI-DB 214) to determine if the processes are identifying the error source consistently. When the error sources are the same, the neural network may use the error signal 308 for fine tuning. The neural network 202 may output a value ESE-NN 306 associated with the error source estimation. The value ESE-NN 306 may be a probability or confidence level of the neural network 202 error source identification being correct.

A difference operation 302 may subtract the output ESE-DB 304 of the error fault database 204 from the output ESE-NN 306 of the neural network 202 to create an error signal 308 for tuning the neural network 202. The error signal 308 may be received by the neural network 202 as an indication of the quality of the estimation. Over time, the error signal 308 may approach zero such that the neural network 202 and the error database 204 output the same source identification with same level of confidence. Large magnitude error signals may cause the neural network 202 to adjust weighting values to improve the prediction. When the source identification generated by the error database 204 and the neural network 202 are different, additional adjustments may be made by the neural network 202 to align the source identifications.

As discussed, the source of some errors may be known with a high degree of accuracy. These errors may be used as the initial database for training the neuro-adaptive algorithm. These errors may have an associated confidence or probability that is relatively high. For example, the probability may be expressed as a number between zero and one. A high probability may be a value of one. An error that is stored in the error database 204 with an associated probability value near one may be used directly for error source identification.

When an error condition with an unknown source occurs, the OBCC 180 may record signal values at the time of the error, the estimated source, and the GPS location at which the error occurred. The source identification for these errors may initially be assigned a default value of unknown. Subsequent error occurrences may be compared to the stored occurrences. In particular, the error database 204 process may compare the GPS locations of the error occurrences. If the error occurs again, the GPS location may help to identify the source of the error. If the error occurs consistently at different GPS locations, there may be a higher probability that the error is onboard. The OBCC 180 may be programmed to change the source identification from the default identifier (e.g., unknown) to an identifier representing the vehicle 112 (e.g., an onboard error) in response to the error occurring at least a predetermined number of times with corresponding position coordinates being indicative of different locations. The error database 204 may be updated so that a higher probability is assigned to the onboard error. The OBCC 180 may increase the probability associated with the source identification being the vehicle responsive to occurrences of the digital charging error at different locations. For example, a count may be incremented for each error that occurs at a different location than those that have previously occurred. In some situations, the error may not have occurred the threshold number of times, but the probability may indicate sufficient accuracy. The OBCC 180 may also be programmed to, responsive to the digital charging error occurring less than the predetermined number of times and the probability associated with the source identification being the vehicle is greater than a predetermined probability, change the source identification from the default identifier to the identifier representing the vehicle.

For example, a vehicle condition may cause the timing of charge contactor operation (e.g., open or close) to be incorrect. Such an error may not be dependent on the charge station. For example, such an error condition might be expected at every charge station.

If the GPS locations are the same for different occurrences of the error, there may be a higher probability that the error is due to an offboard source. The OBCC 180 may be programmed to, responsive to the digital charging error occurring at least a predetermined number of times with corresponding position coordinates from the GPS module being indicative of a same location, change the source identification from the default identifier (e.g., unknown) to an identifier representing the EVSE 138 (e.g., offboard charger or component). The neuro-adaptive algorithm may be tuned so that a higher probability is assigned to the offboard error indication under these conditions. Over time, error-related data may be obtained and processed. The neuro-adaptive estimator may become better tuned and error source prediction performance may be improved.

For example, the vehicle may provide a vehicle certificate for charging to the charge station. The charge station may be unable to verify the vehicle certificate and deny charging. The charge station may have an issue with internet access and be unable to access or update certificate information. In this example, the vehicle certificate may be accepted by charge stations at other locations without issue.

If the error occurs, but inconsistently, at the same GPS location, there may be a higher probability that the error is due to an operator-related cause. For example, an operator-related error may be determined when an error occurs inconsistently at a given GPS location. The OBCC 180 may be programmed to, responsive to detecting at least a predetermined number of charge events with corresponding position coordinates from the GPS module being indicative of the same location and the digital charging error occurring for a fraction of the number of charge events, change the source identification from the default identifier to an identifier representing the operator.

For example, the error may be related to a RFID card that is carried by the vehicle operator and scanned by a charge station. The vehicle operator may not be carrying the correct RFID card at all times. As a result, an error may occur inconsistently at a given charge location and the OBCC may not be able to identify the source of the error. Over time, the neuro-adaptive estimator may learn that this is an operator error.

Figure 4:
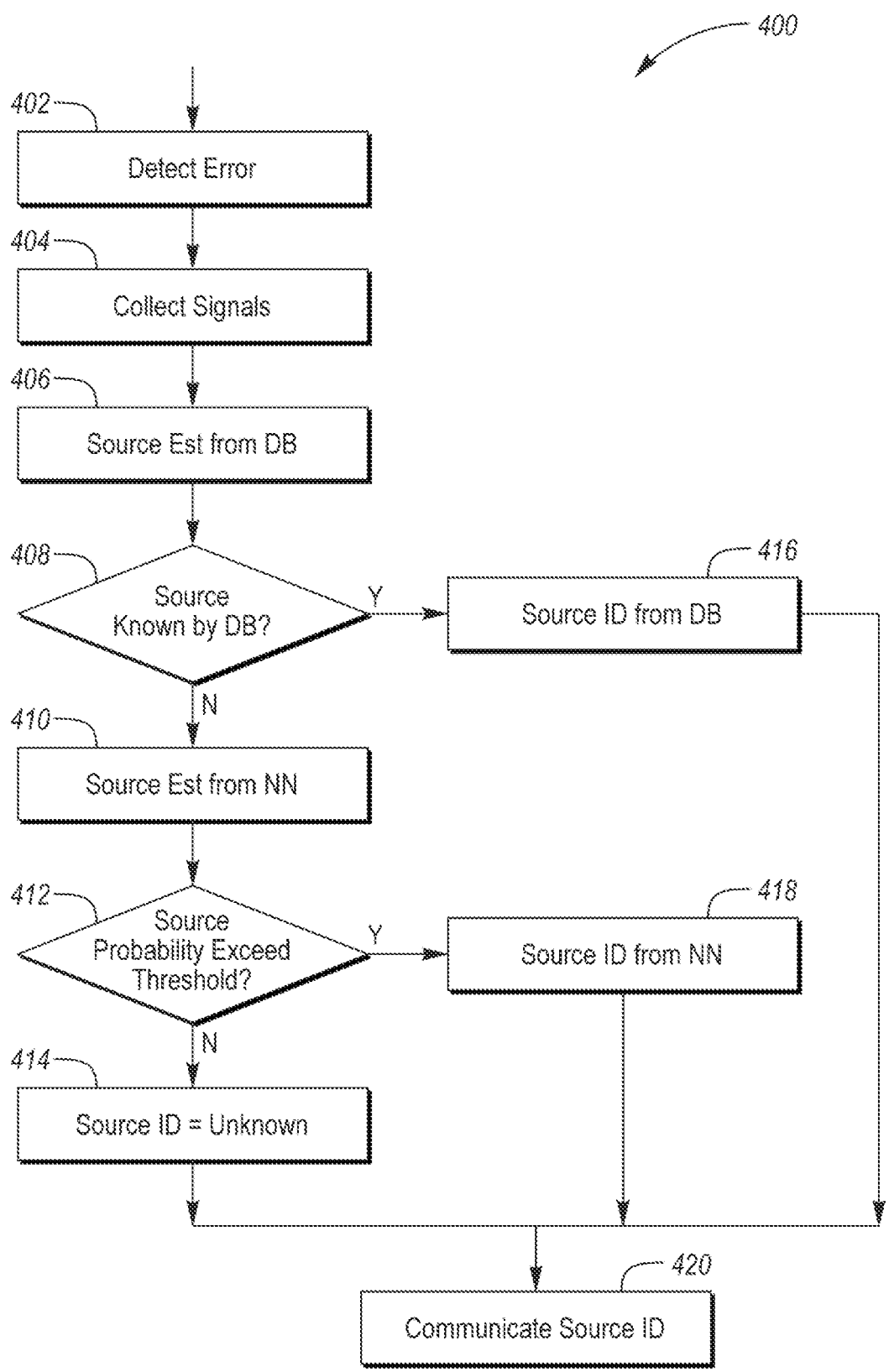
FIG. 4 depicts a flowchart for a process for learning and identifying the source of the charging error.

FIG. 4 depicts a possible flowchart for a process 400 including a sequence of operations to identify the source of a digital charging error. The operations may be implemented as part of a vehicle diagnostic system. At operation 402, the process may implement instructions to detect error conditions. If no errors are detected, the process may remain at operation 402 to continue the error detection process.

Once an error is detected, operation 404 may be performed. At operation 404, signals and variables may be collected as described above. At operation 406, the error and signals may be input to the error database 204 to determine a source identification. The error database 204 may provide a source indication and a confidence value of the accuracy of the source identification. At operation 408, the process checks if the source identification is accurately known by the error database 204. The source identification may be accurately known if the confidence value exceeds a threshold. If the source is known by the error database 204, operation 416 may be performed. At operation 416, the source identification from the error database 204 may be used.

If the source is not accurately known by the error database 204, operation 410 may be performed. At operation 410, the source identification from the neural network 202 may be determined. The signals and variables may be input to the neural network 202 process. The neural network 202 may output a source identification and a confidence or probability value. At operation 412, the process may check if the probability value exceeds a threshold. If the probability exceeds a threshold, then operation 418 may be performed. At operation 418, the source identification from the neural network 202 is output. If the probability does not exceed the threshold, then operation 414 may be performed. At operation 414, the source identification may be set to unknown.

At operation 420, the source identification may be communicated to other devices. The source identification may be communicated to a diagnostic module for later output. The source identification may be stored in nonvolatile memory for later output. The source identification may also be communicated to a diagnostic display within the vehicle. For example, since there is an error condition that may be interrupting the charging process, the system may communicate this interruption to the vehicle operator. For example, the status may be communicated via the user interface 164 via a lamp or display. The display may include the source identification to aid the vehicle operator in determining the cause of the error condition.

The vehicle diagnostic system may also change a recommended service procedure responsive to changing the source identification. The recommended service procedure when the source is identified as the vehicle may be to visit a service facility. Further, the recommended service procedure may further identify a component with the vehicle that can be serviced. The recommend service procedure when the source is identified as the offboard charger may include forwarding the error to the administrator of the offboard charger. This may be done manually or automatically. The recommended service procedure when the source is identified as the operator may include notifying the operator of possible corrective actions. The notification may be on an in-vehicle display or on a remote device such as a mobile phone of the operator.

The system and methods disclosed allow dynamic learning of digital charging errors related to vehicle charging. The system attempts to identify the source of the digital charging errors based on location data corresponding to occurrences of the errors. This allows the source of the error to be correctly identified which can prevent unnecessary service operations to the vehicle. In addition, the system allows possible identification of charge stations that require service.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a controller programmed to receive location data from a global positioning system module and change a source identification for a charging error to a value representing the vehicle responsive to the charging error occurring at a predetermined number of different locations, and, change the source identification to a value representing an offboard charger responsive to the charging error occurring a predetermined number of times at a same location.

2. The vehicle of claim 1 wherein the controller is further programmed to change the source identification to a value representing an operator responsive to the charging error occurring intermittently over a predetermined number of charge events at a same location and not occurring for at least one charge event at a different location.

3. The vehicle of claim 1 wherein the controller is further programmed to learn the source identification using a neural network algorithm.

4. The vehicle of claim 1 wherein the controller is further programmed to assign a probability corresponding to each value of the source identification for the charging error and change the probability based on a location derived from the location data.

5. The vehicle of claim 4 wherein the controller is further programmed to increase the probability associated with the source identification being the value representing the vehicle responsive to occurrences of the charging error at different locations.

6. The vehicle of claim 4 wherein the controller is further programmed to increase the probability associated with the source identification being the value representing the offboard charger responsive to occurrences of the charging error at a same location.

7. The vehicle of claim 1 wherein the controller is further programmed to initialize the source identification for the charging error to a value representing an unknown source.

8. A method comprising:
   by a controller,
   learning a source identification for a charging error that occurs when a vehicle is coupled to an offboard charger;
   changing the source identification from a default identifier to an identifier representing the vehicle responsive to the charging error occurring at least a predetermined number of times with corresponding position coordinates being indicative of different locations; and
   changing a recommended service procedure responsive to changing the source identification.

9. The method of claim 8 further comprising changing the source identification to an identifier representing the offboard charger responsive to the charging error occurring at least a predetermined number of times with corresponding position coordinates being indicative of a same location.

10. The method of claim 8 further comprising assigning a probability corresponding to each value of the source identification and changing the probability based on a location derived from the corresponding position coordinates.

11. The method of claim 10 further comprising increasing the probability associated with the source identification being the vehicle responsive to occurrences of the charging error at different locations.

12. The method of claim 10 further comprising increasing the probability associated with the source identification being the offboard charger responsive to occurrences of the charging error at a same location.

13. The method of claim 10 further comprising changing, responsive to the charging error occurring less than the predetermined number of times and the probability associated with the source identification being the vehicle being greater than a predetermined probability, the source identification from the default identifier to the identifier representing a vehicle.

14. The method of claim 8 further comprising learning the source identification using a neural network.

15. A vehicle diagnostic system comprising:
   a controller programmed to receive location data from a global positioning system module, learn a source identification for a charging error that occurs during charge events, and, responsive to the charging error occurring at least a predetermined number of times with corresponding location data being indicative of the charging error occurring at different locations, change the source identification from a default identifier to an identifier representing the vehicle.

16. The vehicle diagnostic system of claim 15 wherein the controller is further programmed to, responsive to the charging error occurring at least a predetermined number of times with corresponding location data being indicative of the charging error occurring at a same location, change the source identification from the default identifier to an identifier representing an offboard charger.

17. The vehicle diagnostic system of claim 15 wherein the controller is further programmed to, responsive to the charging error occurring intermittently over a predetermined number of charge events at a same location and not occurring for at least one charge event at a different location, change the source identification from the default identifier to an identifier representing an operator.

18. The vehicle diagnostic system of claim 15 wherein the controller is further programmed to assign a probability corresponding to each value of the source identification and change the probability based on a location derived from the location data.

19. The vehicle diagnostic system of claim 18 wherein the controller is further programmed to increase the probability associated with the source identification being the vehicle responsive to occurrences of the charging error at different locations.

20. The vehicle diagnostic system of claim 18 wherein the controller is further programmed to, responsive to the charging error occurring less than the predetermined number of times and the probability associated with the source identification being the vehicle being greater than a predetermined probability, change the source identification from the default identifier to the identifier representing the vehicle.

* * * * *